US010604671B2

(12) United States Patent
Katagiri et al.

(10) Patent No.: US 10,604,671 B2
(45) Date of Patent: Mar. 31, 2020

(54) METHOD FOR PRODUCING CONDUCTIVE FILM, CONDUCTIVE FILM, AND TOUCH PANEL

(71) Applicant: FUJIFILM Corporation, Tokyo (JP)

(72) Inventors: Kensuke Katagiri, Ashigarakami-gun (JP); Shin Tajiri, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 256 days.

(21) Appl. No.: 15/888,486

(22) Filed: Feb. 5, 2018

(65) Prior Publication Data

US 2018/0155568 A1 Jun. 7, 2018

Related U.S. Application Data

(63) Continuation of application No. PCT/JP2016/072275, filed on Jul. 29, 2016.

(30) Foreign Application Priority Data

Aug. 24, 2015 (JP) .................................. 2015-165166

(51) Int. Cl.
*G06F 3/041* (2006.01)
*C09D 113/02* (2006.01)
(Continued)

(52) U.S. Cl.
CPC ............ *C09D 113/02* (2013.01); *B32B 27/18* (2013.01); *C08J 3/24* (2013.01); *C08J 7/042* (2013.01);
(Continued)

(58) Field of Classification Search
CPC ..................... G06F 3/041; G06F 3/044; G06F 2203/04103; H01B 1/22; H01B 5/14; C08J 3/24; G03F 7/06; G03C 1/04; G03C 1/053
(Continued)

(56) References Cited

U.S. PATENT DOCUMENTS

2002/0127410 A1* 9/2002 Eichorst ................... B41M 5/41
428/423.7
2010/0255323 A1* 10/2010 Nakamura ................ H01B 1/22
428/457
(Continued)

FOREIGN PATENT DOCUMENTS

JP 2014-112512 A 6/2014
JP 2015-100973 A 6/2015

OTHER PUBLICATIONS

International Preliminary Report on Patentability and Written Opinion of the International Searching Authority (Forms PCT/IB/326 and PCT/ISA/237) for International Application No. PCT/JP2016/072275, dated Mar. 8, 2018, with English translation.
(Continued)

*Primary Examiner* — John A McPherson
(74) *Attorney, Agent, or Firm* — Birch, Stewart, Kolasch & Birch, LLP

(57) ABSTRACT

A method for producing a conductive film having a substrate and a conductive layer disposed on the substrate has a first step of forming a precursor layer on the substrate, the precursor layer including a metal component or its precursor, a water-insoluble polymer X having a cross-linking group, a water-insoluble polymer Y having a reactive group that reacts with the cross-linking group, and a water-soluble polymer Z different from polymer X and polymer Y; a second step of reacting the cross-linking group in the water-insoluble polymer X with the reactive group in the
(Continued)

water-insoluble polymer Y; and a third step of forming the conductive layer by removing the water-soluble polymer Z.

10 Claims, 2 Drawing Sheets

(51) Int. Cl.

| | |
|---|---|
| H01B 1/22 | (2006.01) |
| G03C 1/04 | (2006.01) |
| C08K 3/08 | (2006.01) |
| B32B 27/18 | (2006.01) |
| G03F 7/40 | (2006.01) |
| C08J 7/04 | (2020.01) |
| H01B 5/14 | (2006.01) |
| C08J 3/24 | (2006.01) |
| C09D 5/24 | (2006.01) |
| C09D 189/06 | (2006.01) |
| G03F 7/06 | (2006.01) |
| G03F 7/16 | (2006.01) |
| G03F 7/20 | (2006.01) |
| G03F 7/32 | (2006.01) |
| G06F 3/044 | (2006.01) |
| H01B 13/00 | (2006.01) |
| H03K 17/96 | (2006.01) |
| C08L 39/04 | (2006.01) |
| C08L 33/02 | (2006.01) |

(52) U.S. Cl.
CPC .............. *C08J 7/047* (2013.01); *C08K 3/08* (2013.01); *C09D 5/24* (2013.01); *C09D 189/06* (2013.01); *G03C 1/04* (2013.01); *G03F 7/06* (2013.01); *G03F 7/16* (2013.01); *G03F 7/2002* (2013.01); *G03F 7/327* (2013.01); *G03F 7/40* (2013.01); *G06F 3/041* (2013.01); *G06F 3/044* (2013.01); *H01B 1/22* (2013.01); *H01B 5/14* (2013.01); *H01B 13/0036* (2013.01); *H03K 17/962* (2013.01); *C08J 2313/02* (2013.01); *C08J 2367/02* (2013.01); *C08J 2389/06* (2013.01); *C08J 2413/02* (2013.01); *C08J 2433/00* (2013.01); *C08J 2433/10* (2013.01); *C08J 2489/06* (2013.01); *C08K 2003/0806* (2013.01); *C08K 2201/001* (2013.01); *C08L 33/02* (2013.01); *C08L 39/04* (2013.01); *G06F 2203/04103* (2013.01)

(58) Field of Classification Search
USPC .................... 430/18, 319, 321, 627
See application file for complete search history.

(56) References Cited

U.S. PATENT DOCUMENTS

| | | | |
|---|---|---|---|
| 2012/0107598 A1* | 5/2012 | Zou .................. | C09D 7/70 428/292.1 |
| 2014/0090884 A1* | 4/2014 | Kobayashi ............ | H05K 1/095 174/388 |
| 2014/0370311 A1* | 12/2014 | Boulord ............. | B23K 35/3618 428/457 |
| 2015/0234271 A1 | 8/2015 | Tokunaga et al. | |
| 2016/0244580 A1 | 8/2016 | Watanabe et al. | |

OTHER PUBLICATIONS

International Search Report (Form PCT/ISA/210) for International Application No. PCT/JP2016/072275, dated Oct. 18, 2016, with English translation.

\* cited by examiner

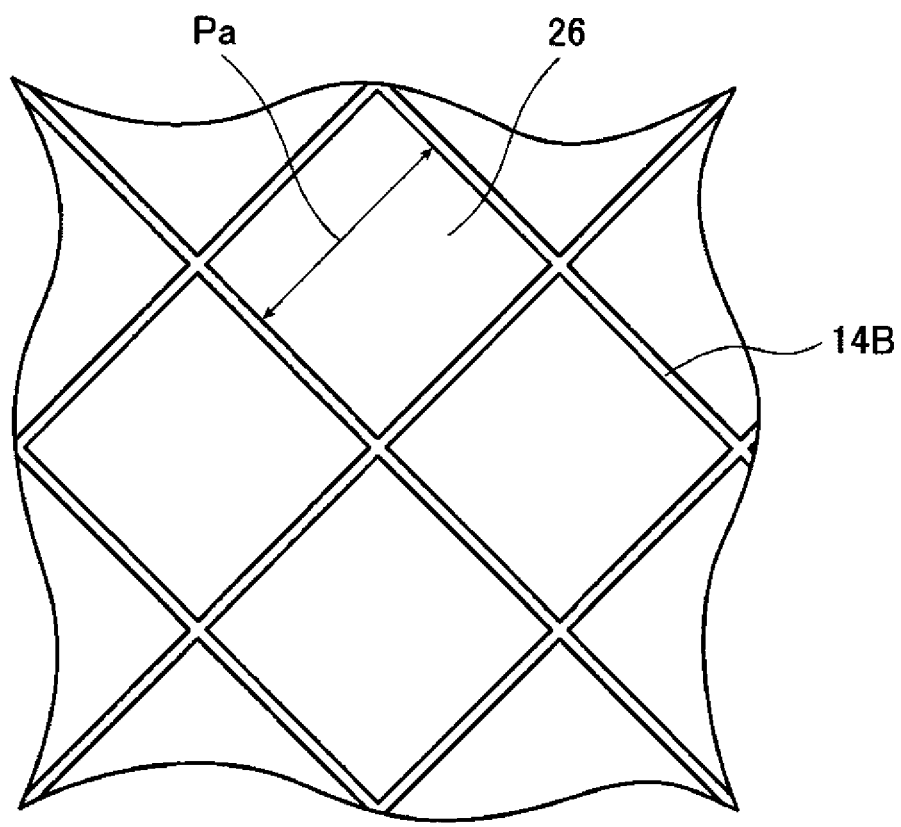

METHOD FOR PRODUCING CONDUCTIVE FILM, CONDUCTIVE FILM, AND TOUCH PANEL

CROSS-REFERENCE TO RELATED APPLICATIONS

This application is a Continuation of PCT International Application No. PCT/JP2016/72275, filed on Jul. 29, 2016, which claims priority under 35 U.S.C. § 119(a) to Japanese Patent Application No. 2015-165166, filed on Aug. 24, 2015. Each of the above application(s) is hereby expressly incorporated by reference, in its entirety, into the present application.

BACKGROUND OF THE INVENTION

1. Field of the Invention

The present invention relates to a method for producing a conductive film, particularly, a method for producing a conductive film having excellent conductive properties and including a conductive layer less prone to peeling, a conductive film, and a touch panel.

2. Description of the Related Art

Conductive films including a substrate and a conductive layer formed thereon have been widely used, for example, for electrodes of various electronic devices such as solar batteries, inorganic electroluminescence (EL) elements, and organic EL elements; electromagnetic shields of various display devices; touch panels; and transparent planar heating elements. Particularly in recent years, touch panels have been increasingly used in cellular phones, portable game consoles, and the like, and there has been a rapidly increasing demand for conductive films used as touch panel sensors.

As a method for producing such a conductive film (conductive sheet), a method including exposing and developing a silver-halide-containing photosensitive layer including a silver halide, gelatin, and a polymer different from gelatin and removing the gelatin is disclosed, for example, in JP2014-112512A. JP2014-112512A describes that a cross-linker for cross-linking polymers together may be used, and in JP2014-112512A, water-soluble cross-linkers are mainly disclosed as cross-linkers.

SUMMARY OF THE INVENTION

With increasing demand for improvements in performance of various apparatuses, further improvements in conductive properties of conductive layers in conductive films have been demanded. More specifically, further decreases in surface electrical resistance of conductive layers have been demanded.

The surface electrical resistance of a conductive layer can be decreased, for example, by increasing the amount of metal component in the conductive layer, in other words, by decreasing the amount of nonmetal component in the conductive layer.

The inventors produced a conductive film including a conductive layer by using a water-soluble cross-linker according to the method in JP2014-112512A and investigated the properties of the conductive film to find that the conductive layer may have high surface electrical resistance and that migration (ion migration) of metal ions is likely to occur in the conductive layer.

The inventors have also found that when a larger amount of water-soluble polymer binder, such as gelatin, is removed to increase the relative amount of metal component in order to enhance conductive properties, the conductive layer itself tends to peel off a substrate.

That is, it has been difficult to achieve, in a conductive film, improvement in conductive properties, suppression of the occurrence of ion migration, and suppression of conductive layer peeling all at high levels.

In view of the above circumstances, an object of the present invention is to provide a method for producing a conductive film including a conductive layer that has excellent conductive properties, is less prone to ion migration, and is less prone to peeling.

Another object of the present invention is to provide a conductive film and a touch panel.

As a result of intensive studies to achieve the above objects, the inventors discovered that the use of a water-insoluble high-molecular cross-linker produces the desired effects.

Specifically, the inventors discovered that the above objects can be achieved through the following structure.

(1) A method for producing a conductive film having a substrate and a conductive layer disposed on the substrate, the method having a first step of forming a precursor layer on the substrate, the precursor layer including a metal component or its precursor, a water-insoluble polymer X having a cross-linking group, a water-insoluble polymer Y having a reactive group that reacts with the cross-linking group, and a water-soluble polymer Z different from the water-insoluble polymer X and the water-insoluble polymer Y; a second step of reacting the cross-linking group in the water-insoluble polymer X with the reactive group in the water-insoluble polymer Y; and a third step of forming the conductive layer by removing the water-soluble polymer Z.

(2) The method for producing a conductive film according to (1), in which the first step has forming the precursor layer by applying to the substrate a lower-coating-forming composition including at least one of the water-insoluble polymer X or the water-insoluble polymer Y and an upper-coating-forming composition at least including the other one of the water-insoluble polymer X or the water-insoluble polymer Y, the water-soluble polymer Z, and the metal component or its precursor.

(3) The method for producing a conductive film according to (1) or (2), in which one of the cross-linking group and the reactive group is an oxazoline group.

(4) The method for producing a conductive film according to any one of (1) to (3), in which the water-soluble polymer Z includes gelatin.

(5) The method for producing a conductive film according to any one of (1) to (4), in which the metal component or its precursor is a silver halide, the method further having, before the third step, subjecting the silver halide to an exposure treatment and then performing a development treatment to form metal silver.

(6) The method for producing a conductive film according to any one of (1) to (5), the method further having, after the third step, performing a heat treatment on the conductive layer.

(7) A conductive film having a substrate and a conductive layer that is disposed on the substrate and includes a metal component, in which the conductive layer includes a polymer W formed as a result of a reaction between a water-insoluble polymer X having a cross-linking group and a water-insoluble polymer Y having a reactive group that reacts with the cross-linking group, and in the conductive layer, an average area fraction of the metal component is 85% or more in a metal-containing region.

In a vertical section of the conductive layer, the metal-containing region is a region extending from a middle position between an upper end position and a lower end position toward the substrate side by 50 nm and toward a surface X side by 50 nm. When a contour along a profile of the surface X of the conductive layer is moved from the surface X being a surface on a side opposite to the substrate side toward the substrate side, a position where the contour reaches the metal component included in the conductive layer is the upper end position. When the contour is moved from the upper end position toward the substrate side, a position where the metal component ceases to exist in the conductive layer is the lower end position.

(8) The conductive film according to (7), in which one of the cross-linking group and the reactive group is an oxazoline group.

(9) A touch panel including the conductive film according to (7) or (8).

The present invention can provide a method for producing a conductive film including a conductive layer that has excellent conductive properties, is less prone to ion migration, and is less prone to peeling.

The present invention can also provide a conductive film and a touch panel.

BRIEF DESCRIPTION OF THE DRAWINGS

FIG. 3 is a plan view of an exemplary mesh pattern formed by a conductive thin wire.

DESCRIPTION OF THE PREFERRED EMBODIMENTS

Figure 1:
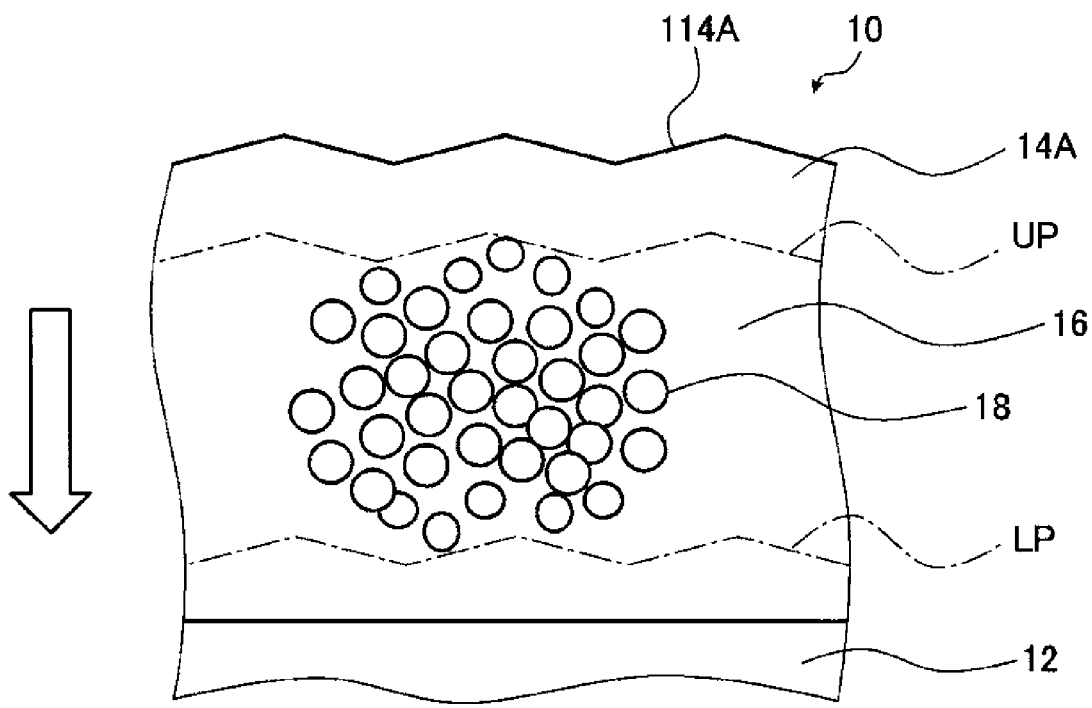
FIG. 1 is a sectional view of a conductive film according to one embodiment of the present invention.

A preferred embodiment of a method for producing a conductive film according to the present invention will now be described.

Every numerical range expressed using " . . . to . . . " throughout this specification means a range including the numerical values before and after "to" as a lower limit and an upper limit.

As used herein, "(meth)acrylate" means "at least one of acrylate or methacrylate".

One feature of the present invention is the use of a water-insoluble polymer X having a cross-linking group (hereinafter also referred to simply as "polymer X") and a water-insoluble polymer Y having a reactive group that reacts with the cross-linking group (hereinafter also referred to simply as "polymer Y"). Although the mechanism of the invention is not fully understood, a polymer W formed as a result of the reaction between polymer X and polymer Y can more firmly hold a metal component in a conductive layer with a small amount than a low-molecular cross-linker, resulting in suppression of peeling of the conductive layer and improved conductive properties. In addition, since polymer X and polymer Y are both water-insoluble, the conductive layer has more excellent conductive properties and the occurrence of ion migration in the conductive layer is suppressed, unlike when a water-soluble cross-linker is used.

The conductive film of the present invention also has an advantage in that increases in haze can be suppressed.

The method for producing a conductive film according to the present invention has at least three steps (first to third steps) below.

First step: a step of forming a precursor layer on a substrate, the precursor layer including a metal component or its precursor, a water-insoluble polymer X having a cross-linking group, a water-insoluble polymer Y having a reactive group that reacts with the cross-linking group, and a water-soluble polymer Z different from the polymer X and the polymer Y Second step: a step of reacting the cross-linking group in water-insoluble polymer X with the reactive group in water-insoluble polymer Y Third step: a step of forming a conductive layer by removing water-soluble polymer Z The procedures of these steps will be described below in detail.

First Step

The first step is a step of forming a precursor layer on a substrate, the precursor layer including a metal component or its precursor, a water-insoluble polymer X having a cross-linking group, a water-insoluble polymer Y having a reactive group that reacts with the cross-linking group, and a water-soluble polymer Z different from polymer X and polymer Y (hereinafter also referred to simply as "polymer Z"). By performing predetermined treatments described below on the precursor layer formed in this step, a conductive layer is formed. As will be described in detail later, the precursor layer may have a single-layer structure or a multilayer structure (a structure including two or more layers).

The first step may be performed by any procedure as long as the precursor layer including a metal component or its precursor, polymer X, polymer Y, and polymer Z can be formed on the substrate.

More specifically, in the case of a precursor layer having a single-layer structure, the precursor layer may be formed by applying a precursor-layer-forming composition including the above components to a substrate and optionally performing a drying treatment.

In the case of a precursor layer having a multilayer structure, the precursor layer including the above components may be formed by applying a composition including some of the components to a substrate to form a coating and further applying a composition including the rest of the components to the coating.

In particular, to achieve at least one of more excellent conductive properties of the conductive layer, further suppression of the occurrence of ion migration in the conductive layer, or further suppression of peeling of the conductive layer (hereinafter also referred to simply as "to better produce the effects of the present invention"), the first step is preferably a step of forming a precursor layer by applying to a substrate a lower-coating-forming composition including at least one of water-insoluble polymer X or water-insoluble polymer Y and an upper-coating-forming composition at least including the other one of water-insoluble polymer X or water-insoluble polymer Y, water-soluble polymer Z, and a metal component or its precursor.

The application of the lower-coating-forming composition and the application of the upper-coating-forming composition may be performed simultaneously or separately. That is, the first step is preferably an embodiment including step A or an embodiment including steps B and C.

Step A: a step of forming a precursor layer by simultaneously and layeredly applying to a substrate a lower-coating-forming composition including at least one of water-insoluble polymer X or water-insoluble polymer Y and an upper-coating-forming composition at least including the other one of water-insoluble polymer X or water-insoluble polymer Y, water-soluble polymer Z, and a metal component or its precursor, the lower-coating-forming composition and the upper-coating-forming composition being disposed in this order from the substrate side Step B: a step of forming on a substrate a lower coating including at least one of water-insoluble polymer X or water-insoluble polymer Y Step C: a step of forming on the lower coating an upper coating at least including the other one of water-insoluble polymer X or water-insoluble polymer Y, water-soluble polymer Z, and a metal component or its precursor, thereby forming a precursor layer When polymer X and polymer Y are included in different layers as in the embodiment including step A and the embodiment including steps B and C, the reaction between polymer X and polymer Y proceeds gradually at the interface between a layer including polymer X and a layer including polymer Y, and the reaction area expands as polymer X and polymer Y are diffused.

The embodiment including step A and the embodiment including steps B and C will now be described in detail. Components used in these steps will be described in detail later.

Step A

Step A is a step of forming a precursor layer by simultaneously and layeredly applying to a substrate a lower-coating-forming composition including at least one of polymer X or polymer Y and an upper-coating-forming composition at least including the other one of polymer X or polymer Y, polymer Z, and a metal component or its precursor, the lower-coating-forming composition and the upper-coating-forming composition being disposed in this order from the substrate side. By performing this step, the lower-coating-forming composition and the upper-coating-forming composition are simultaneously and layeredly applied to the substrate so as to be laminated in this order from the substrate side, and a precursor layer including a lower coating and an upper coating is formed.

The lower-coating-forming composition includes at least one of polymer X or polymer Y, i.e., one of polymer X or polymer Y or both. In particular, to better produce the effects of the present invention, the lower-coating-forming composition preferably includes both polymer X and polymer Y. The lower-coating-forming composition may include polymer Z described below.

The upper-coating-forming composition at least includes the other one of polymer X or polymer Y, polymer Z, and a metal component or its precursor. "The other of polymer X or polymer Y" refers to either polymer X or polymer Y, whichever is not included in the lower-coating-forming composition when the lower-coating-forming composition includes one of polymer X or polymer Y.

The lower-coating-forming composition may include both polymer X and polymer Y as described above. In this case, the upper-coating-forming composition only needs to include at least one of polymer X or polymer Y.

The upper-coating-forming composition may also include both polymer X and polymer Y. That is, the upper-coating-forming composition may include the other one of polymer X or polymer Y or both.

In particular, to better produce the effects of the present invention, an embodiment in which one of the lower-coating-forming composition and the upper-coating-forming composition includes both polymer X and polymer Y and the other one of the lower-coating-forming composition and the upper-coating-forming composition includes at least one of polymer X or polymer Y is preferred. An embodiment in which the lower-coating-forming composition includes both polymer X and polymer Y and the upper-coating-forming composition includes at least one of polymer X or polymer Y is more preferred. An embodiment in which both the lower-coating-forming composition and the upper-coating-forming composition include polymer X and polymer Y is still more preferred.

The above-described preferred embodiments of the lower-coating-forming composition and the upper-coating-forming composition apply not only to the embodiment including step A but also to the embodiment including steps B and C described below.

The simultaneous multilayer coating of the lower-coating-forming composition and the upper-coating-forming composition may be performed by any known method, and it is preferable to use die coating, for example. Die coating is carried out in a slide coating mode, an extrusion coating mode, or a curtain coating mode. The slide coating mode and the extrusion coating mode are preferred, and the extrusion coating mode, which is very suitable for thin-layer coating, is more preferred.

After the simultaneous multilayer coating is performed, the resulting coating may optionally be subjected to a drying treatment. The drying treatment facilitates removal of solvent from the precursor layer.

In the simultaneous multilayer coating, the lower-coating-forming composition and the upper-coating-forming composition may be used each independently in two or more types. For example, the simultaneous multilayer coating may be performed using two types of lower-coating-forming composition and one type of upper-coating-forming composition to form a precursor layer having a three-layer structure.

In the simultaneous multilayer coating, a composition other than the lower-coating-forming composition and the upper-coating-forming composition may be used in combination. For example, the lower-coating-forming composition, the upper-coating-forming composition, and a protective-layer-forming composition may be simultaneously and layeredly applied so as to be laminated in this order from the substrate side such that a protective layer is formed on an upper coating. This treatment provides a precursor layer including a lower coating, an upper coating, and a protective layer.

The protective-layer-forming composition is a composition for forming a protective layer formed on an upper coating. From the viewpoint of adhesiveness to the upper coating and an increase in film hardness, the protective-layer-forming composition preferably includes polymer Z and one of polymer X or polymer Y or both.

The precursor layer formed on the substrate by the simultaneous multilayer coating may be disposed over the entire substrate or may be disposed in a pattern on a part of the substrate.

Step B

Step B is a step of forming on a substrate a lower coating including one of polymer X or polymer Y.

This step may be performed by any procedure as long as the lower coating can be formed. For example, a method (coating method) in which a lower-coating-forming composition is applied to a substrate and optionally subjected to a drying treatment to form a lower coating or a method (transfer method) in which a lower coating formed on a temporary substrate is transferred to a substrate may be used. To more readily control the lower coating thickness, the coating method is particularly preferred.

The coating may be performed by any known method such as spin coating, dip coating, roller blade coating, or spray coating.

The drying treatment may be performed by any method such as heating or air drying.

The lower-coating-forming composition for use is as described above.

Step C

Step C is a step of forming a precursor layer by forming, on the lower coating obtained in step B, an upper coating including the other one of polymer X or polymer Y, polymer Z, a metal component or its precursor.

The upper coating may be formed by any method such as the above-described methods (e.g., the coating method and the transfer method) for forming a lower coating. To more readily control the upper coating thickness, a method in which an upper-coating-forming composition is applied to a substrate and optionally subjected to a drying treatment to form an upper coating is preferred.

The types of the coating method are as described above. The methods of the drying treatment are also as described above.

The upper-coating-forming composition for use is as described above.

After step C, the protective-layer-forming composition described above may optionally be applied to the upper coating to form a protective layer.

The precursor layer formed on the substrate may be disposed over the entire substrate or may be disposed in a pattern on a part of the substrate.

The components included in the precursor layer will now be described in detail.

Polymer X and Polymer Y

Polymer X is a polymer having a cross-linking group, and polymer Y is a polymer having a reactive group that reacts with the cross-linking group. Polymer X and polymer Y are both water-insoluble. Polymer X and polymer Y react with each other in the second step described below to form a polymer W. As will be described in detail later, polymer W has a three-dimensional cross-linked structure. Polymer X and polymer Y are preferably different polymers.

"Water-insoluble" means that the solubility in 1 L of water is less than 10 g.

Polymer X and polymer Y are compounds each having a plurality of predetermined repeating units. Low-molecular cross-linkers do not have a plurality of repeating units unlike polymer X and polymer Y.

Polymer X and polymer Y preferably each have a weight average molecular weight of 1,000 or more. A weight average molecular weight of 1,000 or more increases the likelihood that a cross-linking reaction between polymer X and polymer Y occurs selectively, provides an increased film hardness, allows a larger amount of water-soluble polymer Z to be removed, and provides the desired high average area fraction described below to provide a conductive film with low electrical resistance. In particular, to provide a conductive layer with more excellent properties, the weight average molecular weight of polymer X and polymer Y is preferably 1,000 to 1,000,000, more preferably 2,000 to 750,000, still more preferably 3,000 to 500,000.

The weight average molecular weight is measured by gel permeation chromatography (GPC) under the following conditions.

Apparatus: HLC-8320GPC available from Tosoh Corporation

Column: TSK-GEL G3000PWXL available from Tosoh Corporation

Column temperature: 35° C.

Flow rate: 0.5 mL/min

Calibration curve: POLY SODIUM ACRYLATE STANDARD available from Sowa Science Corporation Eluant: a diluted solution of a mixture of sodium dihydrogen phosphate dodecahydrate/disodium hydrogen phosphate dihydrate (34.5 g/46.2 g) in 5,000 g of pure water The cross-linking group included in polymer X may be any group. Examples include an oxazoline group, a carbodiimide group, an isocyanate group, a carboxyl group, an epoxy group, a carboxylic anhydride group, an alkyl halide group, a primary amino group, a secondary amino group, a hydroxyl group, and a vinyl group. The number of cross-linking groups in polymer X may be any number but is typically two or more.

The reactive group included in polymer Y may be any group as long as it reacts with the cross-linking group described above. Examples include an oxazoline group, a carbodiimide group, an isocyanate group, a carboxyl group, an epoxy group, a carboxylic anhydride group, an alkyl halide group, a primary amino group, a secondary amino group, a hydroxyl group, and a vinyl group. The number of reactive groups in polymer Y may be any number but is typically two or more.

Examples of combinations of a cross-linking group and a reactive group suitable for achieving higher reactivity and providing a conductive layer with more excellent properties include combinations of (1) to (10) below.

(1) oxazoline group and carboxyl group
(2) hydroxyl group and isocyanate group
(3) carboxyl group and epoxy group
(4) hydroxyl group and carboxylic anhydride group
(5) carboxyl group and isocyanate group
(6) amino group and isocyanate group
(7) hydroxyl group and epoxy group
(8) amino group and epoxy group
(9) amino group and alkyl halide group
(10) carbodiimide group and carboxyl group In each of the above combinations, whichever of two functional groups may be a cross-linking group, and the other group may be a reactive group. Specifically, in the case of combination (1), when the cross-linking group is an oxazoline group, the reactive group may be a carboxyl group, or when the cross-linking group is a carboxyl group, the reactive group may be an oxazoline group.

Among the above combinations, combinations (1), (3), and (10) are preferred, and combination (1) is more preferred from the viewpoint of reactivity.

In particular, in the case of combination (1), it is preferred that one of the cross-linking group and the reactive group be an oxazoline group and the other one of the cross-linking group and the reactive group be a carboxyl group from the viewpoint of ease of handling and little tendency of the reactive group to be deactivated. In particular, when the cross-linking group or the reactive group is an oxazoline group, the reactivity with an alcoholic hydroxyl group often included in polymer Z, etc. is low, and, advantageously, a cross-linking reaction between polymer X and polymer Y occurs with high selectivity.

Polymer X and polymer Y may each have any main chain structure such as a resin selected from the group consisting of acrylic resins, methacrylic resins, styrene resins, vinyl resins, polyolefin resins, polyester resins, polyurethane resins, polyamide resins, polycarbonate resins, polydiene resins, epoxy resins, silicone resins, cellulose polymers, and chitosan polymers or a copolymer of monomers constituting these resins. The cross-linking group and the reactive group described above may be included in side chains or terminals of these resins. The main chain structure of polymer X and polymer Y is preferably an acrylic resin or a methacrylic resin for its ease of handling.

In particular, in terms of ease of synthesis and ease of handling, polymer X preferably includes a repeating unit represented by formula (1), and polymer Y preferably includes a repeating unit represented by formula (2).

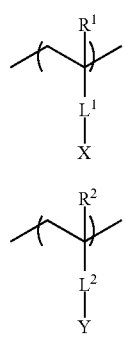

Formula (1)

Formula (2)

In formula (1), $R^1$ represents a hydrogen atom or a substituted or unsubstituted alkyl group.

When $R^1$ is a substituted or unsubstituted alkyl group, $R^1$ is preferably an alkyl group having 1 to 4 carbon atoms, more preferably an alkyl group having 1 to 2 carbon atoms. More specifically, examples of such an unsubstituted alkyl group include a methyl group, an ethyl group, a propyl group, and a butyl group, and examples of such a substituted alkyl group include a methyl group, an ethyl group, a propyl group, and a butyl group that are each substituted with a methoxy group or any other group.

$R^1$ is preferably a hydrogen atom, a methyl group, or a methyl group substituted with a methoxy group, more preferably a hydrogen atom.

In formula (1), $L^1$ represents a single bond or a substituted or unsubstituted divalent organic group. The divalent organic group may be a substituted or unsubstituted aliphatic hydrocarbon group (preferably having 1 to 8 carbon atoms), a substituted or unsubstituted aromatic hydrocarbon group (preferably having 6 to 12 carbon atoms), —O—, —S—, —N(R)— (R: an alkyl group), —CO—, —NH—, —COO—, —CONH—, or a combination thereof (e.g., an alkyleneoxy group, an alkyleneoxycarbonyl group, or an alkylenecarbonyloxy group).

In formula (1), X represents a cross-linking group. The cross-linking group is as defined above.

The amount of the repeating unit represented by formula (1) in polymer X is not particularly limited. To better produce the effects of the present invention, the amount is preferably 0.1 to 100 mol %, more preferably 0.5 to 50 mol %, based on the total amount of repeating unit.

In formula (2), $R^2$ represents a hydrogen atom or a substituted or unsubstituted alkyl group. Preferred alkyl groups are the same as the preferred alkyl groups represented by $R^1$.

In formula (2), $L^2$ represents a single bond or a substituted or unsubstituted divalent organic group. The definition of the divalent organic group is the same as that of the divalent organic group represented by $L^1$.

In formula (2), Y represents a reactive group. The reactive group is as defined above.

The amount of the repeating unit represented by formula (2) in polymer Y is not particularly limited. To better produce the effects of the present invention, the amount is preferably 0.1 to 100 mol %, more preferably 0.5 to 50 mol %, based on the total amount of repeating unit.

Polymer X may have another repeating unit different from the repeating unit represented by formula (1). Polymer Y may have another repeating unit (e.g., a repeating unit derived from a styrene monomer or a (meth)acrylate monomer) different from the repeating unit represented by formula (2).

Polymer X and polymer Y may each be included in the compositions (the lower-coating-forming composition, the upper-coating-forming composition, and the protective-layer-forming composition) in the form of particles. In other words, polymer X and polymer Y may each be included in the compositions in the form of an emulsion.

To better produce the effects of the present invention, when polymer Z described below coexists, polymer X and polymer Y are preferably substantially unreactive with polymer Z. The substantial unreactivity of polymer X and polymer Y with polymer Z facilitates removal of polymer Z from the precursor layer.

"Substantially unreactive" as used herein means that the number of covalent bonds formed through the reaction between the cross-linking group of polymer X or the reactive group of polymer Y and polymer Z relative to the number of covalent bonds formed through the reaction between the cross-linking group of polymer X and the reactive group of polymer Y is 1% or less.

The polymers may be synthesized by any known polymerization method (radical polymerization, cation polymerization). A monomer used for polymerization may be a commercially available product or may be synthesized using a known synthesis method in combination.

Water-Soluble Polymer Z

Polymer Z is a water-soluble polymer. As will be described in detail later, polymer Z is removed from the precursor layer.

"Water-soluble" means that the solubility in 1 L of water is 10 g or more.

Polymer Z may be of any type as long as it is a water-soluble polymer that can be removed by treatments described later. Examples include gelatin, carboxymethylcellulose, carrageenan, gum arabic, albumin, polyethyleneimine, and hydroxypropylcellulose.

In particular, gelatin is preferred to better produce the effects of the present invention.

Any type of gelatin may be used. For example, lime-treated gelatin or acid-treated gelatin may be used. Gelatin hydrolysate, gelatin enzymolysate, and amino-modified or carboxyl-modified gelatin (phthalated gelatin, acetylated gelatin) may also be used.

Metal Component or its Precursor

The metal component is a portion that provides a conductive layer with conductive properties. The metal component is constituted of metal. To provide more excellent conductive properties, the metal constituting the metal component is preferably at least one metal selected from the group consisting of gold (metallic gold), silver (metallic silver), copper (metallic copper), nickel (metallic nickel), and palladium (metallic palladium), more preferably silver.

The metal component may be distributed in the precursor layer in the form of granules.

"Metal component precursor" refers to a component that becomes a metal component by performing a predetermined treatment. Examples include compounds including predetermined metal elements. More specific examples include silver halides and silver behenate. To better produce the effects of the present invention, silver halides are preferred.

A halogen element contained in a silver halide may be chlorine, bromine, iodine, fluorine or a combination thereof. For example, a silver halide composed mainly of silver chloride, silver bromide, and silver iodide is suitable for use, and a silver halide composed mainly of silver bromide and silver chloride is more suitable for use. Silver chlorobromide, silver iodochlorobromide, and silver iodobromide are also suitable for use. Silver chlorobromide, silver bromide, silver iodochlorobromide, and silver iodobromide are more suitable for use. Silver chlorobromide and silver iodochlorobromide containing 50 mol % or more of silver chloride are most suitable for use.

As used herein, "silver halide composed mainly of silver bromide" refers to a silver halide in which the molar fraction of bromide ions in the composition of the silver halide is 50% or more. The silver halide particles composed mainly of silver bromide may contain iodide ions and chloride ions as well as bromide ions.

The silver halide is in the form of solid particles. From the viewpoint of patterning properties of a conductive portion formed after exposure and development treatments, the average particle size, as expressed by sphere equivalent diameter, of the silver halide is preferably 0.1 to 1,000 nm (1 μm), more preferably 0.1 to 300 nm, still more preferably 1 to 200 nm.

"The sphere equivalent diameter of a silver halide particle" is a diameter of a particle having a spherical shape and the same volume.

The silver halide particle may be of any shape, for example, spherical, cubic, tabular (e.g., hexagonal tabular, triangular tabular, or square tabular), octahedral, tetradecahedral, or other various shapes.

For the use of metal compounds belonging to group VIII or VIIIB, such as rhodium compounds and iridium compounds, and palladium compounds, these compounds being used to stabilize the silver halide or increase the sensitivity of the silver halide, reference may be made to a description in paragraph 0039 to paragraph 0042 of JP2009-188360A. Furthermore, for chemical sensitization, reference may be made to a technical description in paragraph 0043 of JP2009-188360A.

Substrate

The substrate may be of any type as long as it can support the conductive layer described below. The substrate is preferably a transparent substrate, particularly preferably a plastic film. The use of a transparent substrate makes the conductive film of the present invention suitable for use as a transparent conductive film.

A material for the substrate is preferably a plastic film having a melting point of about 290° C. or lower. Specific examples include polyethylene terephthalate (PET) (258° C.), polycycloolefin (134° C.), polycarbonate (250° C.), acrylic resin (128° C.), polyethylene naphthalate (PEN) (269° C.), polyethylene (PE) (135° C.), polypropylene (PP) (163° C.), polystyrene (230° C.), polyvinyl chloride (180° C.), polyvinylidene chloride (212° C.), and triacetyl cellulose (TAC) (290° C.). In particular, PET, polycycloolefin, and polycarbonate are preferred. Values in parentheses are melting points. The substrate preferably has a total light transmittance of 85% to 100%.

The substrate may have any thickness. For use in touch panel, electromagnetic shield, and other applications, the thickness can be freely selected typically in the range of 25 to 500 μm. When the substrate functions not only as a substrate but also as a touch surface, the thickness may be more than 500 μm.

One preferred embodiment of the substrate is a treated substrate that has been subjected to at least one treatment selected from the group consisting of atmospheric-pressure plasma treatment, corona discharge treatment, and ultraviolet irradiation treatment. By performing these treatments, hydrophilic groups such as OH groups are introduced onto a surface of the treated substrate, and the adhesiveness of the conductive layer described below is further improved.

In another preferred embodiment of the substrate, the substrate preferably has, on its surface, an undercoat layer including a polymer different from gelatin. By forming a conductive layer on the undercoat layer, the adhesiveness of the conductive layer described below is further improved.

The undercoat layer may be formed by any method, for example, by applying to a substrate an undercoat-layer-forming composition including a polymer different from gelatin and optionally performing a heat treatment. The undercoat-layer-forming composition may optionally include a solvent.

The undercoat layer may have any thickness. To further improve the adhesiveness of the conductive layer, the thickness is preferably 0.02 to 0.3 μm, more preferably 0.03 to 0.2 μm.

Other Components

The compositions (e.g., the lower-coating-forming composition, the upper-coating-forming composition, and the protective-layer-forming composition) used to form a precursor layer may each optionally include a solvent.

The solvent may be of any type, such as water or an organic solvent. Examples of organic solvents include alcohol solvents, ketone solvents, amide solvents, nitrile solvents, ester solvents, carbonate solvents, ether solvents, glycol solvents, amine solvents, thiol solvents, and halogen solvents.

The precursor layer may optionally include additives such as a filler, a rubber component, a flame retardant, a diluent, a thixotropy-imparting agent, a pigment, an anti-foaming agent, a leveling agent, and a coupling agent.

The lower-coating-forming composition described above may optionally include a dye that will be decolorized by alkalis. The dye causes the lower-coating-forming composition to function as what is called an antihalation layer coating liquid.

Precursor Layer

The precursor layer formed by the procedure described above at least includes a metal component or its precursor, polymer X, polymer Y, and polymer Z.

To better produce the effects of the present invention, the amount of polymer X in the precursor layer is preferably 0.001 to 10 g/m$^2$, more preferably 0.01 to 1 g/m$^2$.

To better produce the effects of the present invention, the amount of polymer Y in the precursor layer is preferably 0.001 to 10 g/m$^2$, more preferably 0.01 to 1 g/m$^2$.

To better produce the effects of the present invention, the amount of metal component or its precursor in the precursor layer is preferably 0.1 to 15 g/m$^2$, more preferably 1 to 10 g/m$^2$, in terms of metal amount.

To better produce the effects of the present invention, when the precursor layer has a lower coating formed from the lower-coating-forming composition and an upper coating formed from the upper-coating-forming composition, the percentage of the total volume of polymer X and polymer Y relative to the total volume of the metal component or its precursor, polymer X, and polymer Y in the upper coating is preferably more than 0% by volume and 15% by volume or less, more preferably 0.1% to 10% by volume, still more preferably 1% to 5% by volume. "The volume of a metal component precursor" is a volume in terms of metal.

For example, when the upper coating includes polymer X alone, the percentage of the volume of polymer X is preferably in the above range, with the volume of polymer Y being 0.

Second Step

The second step is a step of reacting the cross-linking group in polymer X with the reactive group in polymer Y. By performing this step, a conductive layer having higher mechanical strength and less prone to peeling is provided.

Although depending on the type of functional group used, the method of reacting the cross-linking group with the reactive group is typically a heat treatment or a photoirradiation treatment. In terms of productivity, a heat treatment is preferred.

The heat treatment may be performed by any method, for example, by bringing the precursor layer into contact with superheated vapor or leaving the precursor layer to stand in an oven or the like.

The heat treatment may be performed under any conditions. Optimal conditions are appropriately selected according to the type of functional group used.

As described above, when the precursor layer has a multilayer structure of two or more layers, and, for example, the lower coating includes polymer X and the upper coating includes polymer Y, the reaction between polymer X and polymer Y gradually proceeds starting in the vicinity of the interface between the two coatings.

Third Step

The third step is a step of forming a conductive layer by removing polymer Z. By performing this step, polymer Z is removed from the precursor layer to increase the relative amount of metal component or its precursor in the conductive layer, resulting in more excellent conductive properties.

Polymer Z is removed by an optimal method selected according to the type of polymer Z used. For example, when polymer Z is gelatin, a method using a proteolytic enzyme or a method using an oxidizing agent may be used.

These two methods will be described below in detail.

When gelatin is removed by using a proteolytic enzyme, the precursor layer including gelatin and the proteolytic enzyme may be brought into contact with each other to break down gelatin. The precursor layer and the proteolytic enzyme may be brought into contact with each other by any method, for example, by bringing a treatment liquid including the enzyme (hereinafter also referred to simply as "treatment liquid 1") into contact with the substrate having the precursor layer. Examples of the method of bringing into contact include applying treatment liquid 1 to the substrate having the precursor layer and immersing the substrate having the precursor layer in treatment liquid 1.

The proteolytic enzyme (hereinafter also referred to as the enzyme) may be a known vegetable or animal enzyme capable of hydrolyzing proteins such as gelatin. Examples include pepsin, rennin, trypsin, chymotrypsin, cathepsin, papain, ficin, thrombin, renin, collagenase, bromelain, and bacterial proteases. Of these, trypsin, papain, ficin, and bacterial proteases are particularly preferred. In particular, bacterial proteases (e.g., Bioprase available from Nagase & Co., Ltd.) are marketed at low prices and readily available.

The enzyme may be contained in any amount in treatment liquid 1. The enzyme content based on the total amount of treatment liquid is suitably about 0.05% to 20% by mass, more preferably 5% to 10% by mass.

Typically, the pH of treatment liquid 1 is preferably 5 to 7. The temperature of the treatment liquid is preferably a temperature that increases the activity of the enzyme, specifically, 25° C. to 45° C.

The contact time is not particularly limited, and is preferably 10 to 500 seconds, more preferably 90 to 360 seconds.

When gelatin is removed by using an oxidizing agent, the precursor layer including gelatin and the oxidizing agent may be brought into contact with each other to decompose gelatin. The precursor layer and the oxidizing agent may be brought into contact with each other by any method, for example, by bringing a treatment liquid including the oxidizing agent (hereinafter also referred to simply as "treatment liquid 2") into contact with the substrate having the precursor layer. Examples of the method of bringing into contact include applying treatment liquid 2 to the substrate having the precursor layer and immersing the substrate having the precursor layer in treatment liquid 2.

The oxidizing agent preferably has a standard electrode potential of +1.5 V or more. As used herein, "standard electrode potential" refers to a standard electrode potential (25° C., E0) relative to a standard hydrogen electrode of the oxidizing agent in an aqueous solution.

Examples of such an oxidizing agent include persulfuric acid, percarbonic acid, perphosphoric acid, peroxoperchloric acid, peracetic acid, methachloroperbenzoic acid, hydrogen peroxide solutions, perchloric acid, periodic acid, potassium permanganate, ammonium persulfate, ozone, hypochlorous acid, and salts thereof.

The contact time is not particularly limited, and is preferably 10 to 500 seconds, more preferably 90 to 360 seconds.

Other Optional Steps

The present invention may include other steps in addition to the first to third steps described above. The optional steps will be described below in detail.

Exposure and Development Step

When the metal component and precursor thereof described above is a silver halide, a step of subjecting the silver halide to an exposure treatment and then performing a development treatment to form metal silver (an exposure and development step) may be further performed before the third step. By performing this step, the silver halide is reduced to form a metal component including metal silver.

This step may be performed at any time before the third step, for example, between the first step and the second step or between the second step and the third step. To better produce the effects of the present invention, the step is preferably performed between the first step and the second step.

The exposure treatment may be performed in a patternwise manner. In an exposed area, a conductive layer including metal silver is formed. In an unexposed area, the silver halide is eluted as a result of the development treatment described below to form a nonconductive portion. The nonconductive portion is substantially free of metal silver. "Nonconductive portion" refers to a region that has no conductivity.

The exposure treatment is a treatment for exposing the silver halide (in other words, a precursor layer including the silver halide). For example, a patternwise exposure treatment causes the silver halide in the exposed area to form a latent image. In the area where the latent image is formed, a conductive layer is formed as a result of the development treatment described below. In the unexposed area that has not been exposed, the silver halide is dissolved and flows out during the development treatment described below to provide a transparent film (nonconductive portion).

Any light source may be used for the exposure. Examples include light such as visible light and ultraviolet light and radiation such as X-rays.

The pattern exposure may be performed by any method. For example, mask exposure using a photomask or scanning exposure using a laser beam may be used. The shape of the pattern is not particularly limited and is appropriately adjusted to the pattern of a conductive layer desired to be formed.

The development treatment may be performed by any method. For example, standard developing techniques used for films for silver halide photography, photographic paper, films for plate-making in printing, emulsion masks for photomasking, and the like can be used.

In the development treatment, any type of developer may be used. For example, a phenidone hydroquinone (PQ) developer, a metol hydroquinone (MQ) developer, or a metol ascorbic acid (MAA) developer can be used.

The development treatment may include a fixing treatment, which is carried out for the purpose of stabilization by removing the silver halide in the unexposed portion. For the fixing treatment, fixing techniques used for films for silver halide photography, photographic paper, films for plate-making in printing, emulsion masks for photomasking, and the like can be used.

The fixing temperature in the fixing treatment is preferably about 20° C. to about 50° C., more preferably 25° C. to 45° C. The fixing time is preferably 5 seconds to 1 minute, more preferably 7 seconds to 50 seconds.

Smoothing Step

Preferably, the invention further has a step of smoothing the conductive layer after the third step. By performing this step, an improvement in conductivity of the conductive layer, an improvement in adhesiveness of the conductive layer, or a reduction in surface electrical resistance is achieved.

The smoothing treatment may be performed by any method, for example, by using a calender roll. A calender roll typically includes a pair of rolls. The smoothing treatment that uses a calender roll is hereinafter referred to as a calendering treatment.

A roll used for the calendering treatment may be a plastic roll made of, for example, epoxy, polyimide, polyamide, or polyimideamide or a metal roll. The lower limit of pressure is preferably 80 MPa or more, more preferably 100 MPa or more. The upper limit of pressure is preferably 120 MPa or less. The pressure is measured using a Prescale (high pressure) available from Fujifilm Corporation.

To provide the conductive layer with higher visibility, the surface roughness Ra of the roll used for the calendering treatment is preferably 0 to 2.0 µm, more preferably 0.3 to 1.0 µm.

The operation temperature of the smoothing treatment typically performed using a calender roll is preferably 10° C. (without temperature conditioning) to 100° C. A more preferred temperature, which varies depending on the scanning density and shape of a pattern of the conductive layer and the type of binder, is in the range of about 10° C. (without temperature conditioning) to 50° C.

As a result of the smoothing treatment, the conductive layer is compacted.

Heating Step

Preferably, the invention further has a step of performing a heat treatment on the conductive layer after the third step. By performing this step, the conductivity of the conductive layer is improved.

One method of the heat treatment is to bring the substrate having the conductive layer into contact with superheated vapor.

The superheated vapor may be superheated water vapor or a mixture of superheated water vapor and any other gas.

The superheated vapor is preferably brought into contact with a conductive portion for a feeding time in the range of 10 seconds to 70 seconds. A feeding time of 10 seconds or longer greatly improves conductivity. The improvement in conductivity reaches saturation at about 70 seconds. Thus, a feeding time of longer than 70 seconds is not preferred in terms of economic efficiency.

The superheated vapor is preferably brought into contact with the conductive portion with a feeding amount in the range of 500 g/m$^3$ to 600 g/m$^3$. The temperature of the superheated vapor is preferably controlled to be 100° C. or higher and 160° C. or lower at one atmospheric pressure.

Another method of the heat treatment is a heat treatment at 80° C. to 150° C.

The heating time is not particularly limited, and to better produce the above effects, the heating time is preferably 0.1 to 5.0 hours, more preferably 0.5 to 1.0 hour.

The smoothing step and the heating step are preferably performed in this order after the third step.

In addition to the above-described steps, the production method of the present invention may further has a reduction step described in paragraph 0095 of JP2014-209332A, a photoirradiation step described in paragraphs 0096 and 0097, a stabilization step described in paragraphs 0104 to 0109, and other steps.

Furthermore, when the precursor layer includes a metal component precursor, a treatment (e.g., a reduction treatment) for converting the precursor into a metal component may be performed as appropriate according to the type of precursor.

Conductive Film

A conductive film obtained by the above-described procedure has the substrate and the conductive layer disposed on the substrate and including the metal component.

The conductive layer includes polymer W formed as a result of the reaction between polymer X and polymer Y. More specifically, the conductive layer includes polymer W formed as a result of the reaction between a cross-linking group in polymer X and a reactive group in polymer Y. Polymer W has a three-dimensional cross-linked structure formed from polymer X and polymer Y.

Since polymer Z is removed from the precursor layer as described above, the conductive layer substantially does not include polymer Z. Polymer Z may be partially included as long as the effects of the present invention are not adversely affected.

The amount of polymer W in the conductive layer is not particularly limited. To better produce the effects of the present invention, the amount is preferably 0.01% to 3% by mass, more preferably 0.1% to 1% by mass, based on the total mass of the conductive layer.

In the conductive layer, an average area fraction of the metal component is 85% or more in a metal-containing region. To better produce the effects of the present invention, the average area fraction is more preferably 90% or more. The upper limit is typically, but not limited to, about 99%.

Referring to FIG. 1, the metal-containing region will be described in detail below.

FIG. 1 is a sectional view of a conductive film according to one embodiment of the present invention. A conductive film 10 includes a substrate 12 and a conductive layer 14A disposed on the substrate 12. The conductive layer 14A includes a polymer W 16 and a plurality of metal components 18 dispersed in the polymer W 16.

In a vertical section of the conductive layer 14A (a section obtained when the conductive film 10 is cut vertically to a surface of the conductive layer 14A; the method of obtaining the vertical section will be described in detail later.) as shown in FIG. 1, a contour along a profile of a surface 114A (a surface opposite to the substrate 12 side) (hereinafter also referred to as a surface X) of the conductive layer 14A is moved from the surface 114A of the conductive layer 14A toward the substrate 12 side. That is, the contour along the profile of the surface 114A of the conductive layer 14A is moved in the direction of an arrow outline with a blank inside.

A position where the moving contour reaches any of the metal components 18 in the conductive layer 14A as shown in FIG. 1 is defined as an upper end position UP. "The position where the contour reaches any of the metal components 18" means a position where the contour first touches any of the metal components 18 when the contour is moved as described above.

The contour is then further moved from the upper end position UP toward the substrate 12 side. A position where the metal components 18 cease to exist in the conductive layer 14A is defined as a lower end position LP. "The position where the metal components 18 cease to exist" means a position from which to the surface of the substrate 12 the metal components 18 are not included and which is nearest to the surface X side. In other words, the lower end position LP is a position where the metal component nearest to the substrate 12 side and the contour are in contact with each other at a position nearest to the substrate 12 side in the vertical section of the conductive layer 14A.

Figure 2:
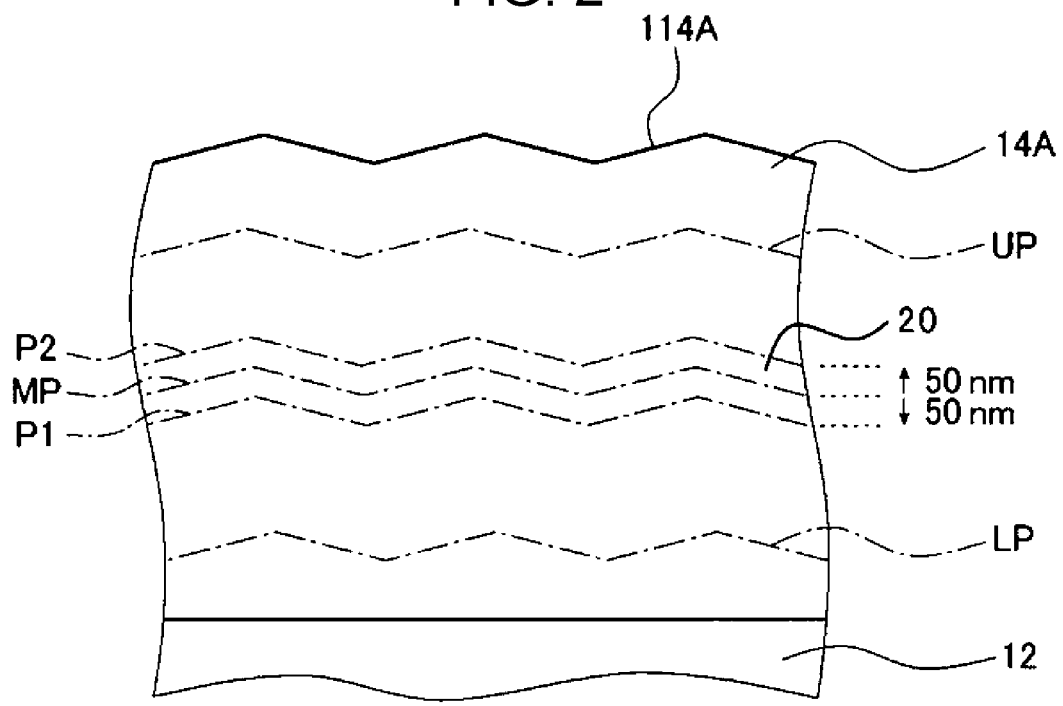
FIG. 2 is an illustration for calculating an average area fraction.

Referring now to FIG. 2, how to determine the average area fraction of the metal component in the metal-containing region in the conductive layer will be described in detail. FIG. 2, as with FIG. 1, is a partially enlarged sectional view of a conductive layer and corresponds to a figure obtained by omitting the metal components 18 from FIG. 1. The positions of the upper end position UP and the lower end position LP in FIG. 1 are respectively the same as those of the upper end position UP and the lower end position LP in FIG. 2.

In the conductive layer 14A, a region extending from a middle position MP between the upper end position UP and the lower end position LP toward the substrate 12 side by 50 nm and toward the surface 114A side by 50 nm is defined as a metal-containing region 20. The average area fraction of the metal component in this region is 85% or more.

The middle position MP is a position midway between the upper end position UP and the lower end position LP, as shown in FIG. 2. "A position 50 nm from the middle position MP toward the substrate 12 side" corresponds to a position P1, where the contour is located when it is moved from the middle position MP toward the substrate 12 side by 50 nm. That is, the distance between the middle position MP and the position P1 is 50 nm. "A position 50 nm from the middle position MP toward the surface 114A side" corresponds to a position P2, where the contour is located when it is moved from the middle position MP toward the surface 114A side by 50 nm. That is, the distance between the middle position MP and the position P2 is 50 nm. Hence, a region bounded by the position P1 and the position P2 corresponds to the region (the metal-containing region 20) extending from the middle position MP toward the substrate 12 side by 50 nm and toward the surface 114A side by 50 nm.

An area fraction of the metal component in the metal-containing region is a value obtained by dividing an area of the metal component included in the metal-containing region by an area of the metal-containing region and multiplying the quotient by 100. That is, an area fraction of the metal component is a value determined by {(area of metal component included in metal-containing region)/(area of metal-containing region)}×100. The above-described average area fraction is an arithmetic average of 10 area fraction values determined from an observation view of a vertical section of the conductive layer, as will be described in detail later.

More specifically, the area fraction of the metal component in the metal-containing region is measured in the following manner. First, the conductive layer is cut to obtain a vertical sectional view of the conductive layer. The cutting may be performed by any method as long as the metal component and polymer W are not deformed. A method such as microtomy or focused ion beam (FIB, Ga ion) technology can be used.

The vertical section of the conductive layer is observed as follows. Using a scanning electron microscope, an acceleration voltage that makes a contrast between the metal component and polymer W (binder portion) is selected. A total of 10 fields are micrographed, and bounds of the metal component and the metal-containing region are defined in each field. Area fractions of the metal component are determined by the above-described method and averaged to determine the average area fraction.

The area of the metal component can be calculated by cutting out a contrast region indicating the metal component in the micrograph (observation view), cutting out the metal-containing region in the same micrograph taken separately, and weighing these regions. More simply, areas of contrasts of the metal component and the other region (e.g., the binder portion including polymer W) can be measured by using commercially available image processing software. The metal component and the other region (e.g., the binder portion including polymer W) can be distinguished from each other by combined use of energy-dispersive X-ray spectroscopy (EDX) with a scanning electron microscope.

The average area fraction means a metal area fraction per unit area of the metal-containing region in a vertical section. By integrating the average area fraction over a unit length in a direction perpendicular to the vertical section (a direction parallel to a support surface), a metal volume fraction of the metal-containing region is determined. That is, in a region where the average area fraction is uniform in the direction parallel to the support surface, the average area fraction and the metal volume fraction have the same meaning.

The conductive layer may be disposed over the entire substrate or may be disposed in a pattern on the substrate.

The conductive layer may have any thickness. In terms of the balance between slimness and conductive properties, the thickness is preferably 200 µm or less, more preferably 30 µm or less, still more preferably 10 µm or less, particularly preferably 0.1 to 5 µm.

The conductive layer may be formed in the shape of a thin wire. That is, the conductive layer may be disposed in the form of a conductive thin wire.

The conductive thin wire may have any line width. In terms of the balance between conductive properties and low visibility of the conductive thin wire, the line width is preferably 30 μm or less, more preferably 15 μm or less, still more preferably 10 μm or less, particularly preferably 5 μm or less, most preferably 4 μm or less, and preferably 0.5 μm or more, more preferably 1.0 μm or more.

The conductive thin wire may form a predetermined pattern. For example, the pattern may have any shape and preferably has a geometric shape including triangles such as regular triangles, isosceles triangles, and right triangles, quadrangles such as squares, rectangles, rhombuses, parallelograms, and trapezoids, (regular) n-gons such as (regular) hexagons and (regular) octagons, circles, ovals, pentagrams, and other shapes in combination. The pattern is more preferably mesh-like (a mesh pattern). "Mesh-like" means a shape including a plurality of square opening portions (grid units) 26 defined by intersecting conductive thin wires 14B, as shown in FIG. 3.

The opening portions 26 may each have any sidelength Pa. The sidelength Pa is preferably 1,500 μm or less, more preferably 1,300 μm or less, still more preferably 1,000 μm or less, and preferably 5 μm or more, more preferably 30 μm or more, still more preferably 80 μm or more. Opening portions having a sidelength in this range enable better retention of transparency and make it possible that displays are seen without discomfort when the conductive film is mounted to the front of a display device.

In terms of visible light transmittance, the opening ratio of the mesh pattern formed by the conductive thin wire is preferably 85% or more, more preferably 90% or more, still more preferably 95% or more. "Opening ratio" is a percentage of a region where the conductive thin wire does not lie in the total region on the support.

The conductive film can be used in various applications. For example, the conductive film can be used as an electrode (e.g., a touch panel electrode, an inorganic EL element electrode, an organic EL element electrode, or a solar battery electrode), a heating sheet, or a printed wiring board. In particular, the conductive film is suitable for use in a touch panel, particularly suitable for use in a capacitive touch panel.

In addition, the conductive film can also be used as an electromagnetic shield that blocks electromagnetic waves such as radio waves or microwaves (ultrashort waves) generated from personal computers, workstations, and the like and that prevents static electricity. The conductive film can be used not only as an electromagnetic shield used in a personal computer main body but also as an electromagnetic shield used in an image-capturing apparatus, an electronic medical apparatus, and the like.

In addition, the conductive film can also be used as a transparent heating element.

EXAMPLES

The present invention will now be described in more detail with reference to examples of the present invention. It should be noted that materials, amounts, percentages, treatments, treatment procedures, etc. used in the following examples can be changed as appropriate without departing from the spirit of the present invention. Therefore, specific examples described below should not be construed as limiting the scope of the present invention.

Example 1

Preparation of Emulsion

To a solution 1 below maintained at 38° C. and pH 4.5, a solution 2 and a solution 3 below each in an amount of 90% were added in parallel with stirring over 20 minutes to form a nuclear particle of 0.16 μm. Subsequently, a solution 4 and a solution 5 below were added thereto over 8 minutes, and the rest (10%) of solution 2 and the rest (10%) of solution 3 were added thereto over 2 minutes to grow the particle to 0.21 μm. Furthermore, 0.15 g of potassium iodide was added thereto, and the resultant was aged for 5 minutes to stop the particle formation.

| Solution 1: | |
|---|---|
| Water | 750 ml |
| Gelatin (phthalated gelatin) | 8 g |
| Sodium chloride | 3 g |
| 1,3-Dimethylimidazolidine-2-thione | 20 mg |
| Sodium benzenethiosulfonate | 10 mg |
| Citric acid | 0.7 g |

| Solution 2: | |
|---|---|
| Water | 300 ml |
| Silver nitrate | 150 g |

| Solution 3: | |
|---|---|
| Water | 300 ml |
| Sodium chloride | 38 g |
| Potassium bromide | 32 g |
| Potassium hexachloroiridate (III) (20% aqueous solution of 0.005% KCl) | 5 ml |
| Hexachloro rhodium acid ammonium (20% aqueous solution of 0.001% NaCl) | 7 ml |

| Solution 4: | |
|---|---|
| Water | 100 ml |
| Silver nitrate | 50 g |

| Solution 5: | |
|---|---|
| Water | 100 ml |
| Sodium chloride | 13 g |
| Potassium bromide | 11 g |
| Yellow prussiate of potash | 5 mg |

The resultant was then washed with water by a flocculation process as usual. Specifically, the temperature was decreased to 35° C., and 3 liters of distilled water was added to the resultant, after which the pH was decreased using sulfuric acid until a silver halide precipitated (the range of pH was 3.6±0.2). Next, about 3 liters of the supernatant fluid was removed (first water-washing). Another 3 liters of distilled water was added to the resultant, and then sulfuric acid was added thereto until a silver halide precipitated. Again, 3 liters of the supernatant fluid was removed (second water-washing). The same procedure as the second water-washing was repeated one more time (third water-washing) to stop the water-washing and desalting step. The emulsion that has been subjected to water-washing and desalting was adjusted to have a pH of 6.4 and a pAg of 7.5, and 10 mg of sodium benzenethiosulfonate, 3 mg of sodium benzenethiosulfinate, 15 mg of sodium thiosulfate, and 10 mg of chloroauric acid was added thereto. The resultant was subjected to chemical sensitization at 55° C. so as to have optimal sensitivity. Subsequently, 100 mg of 1,3,3a,7-tetraazaindene serving as a stabilizer and 100 mg of a Proxel (trade name, ICI Co., Ltd.) serving as a preservative were added thereto. The final emulsion was a silver iodochlorobromide cubic grain emulsion including 0.08 mol % silver iodide and silver chlorobromide composed of 70 mol % silver chloride and 30 mol % silver bromide and having an average grain size of 0.22 µm and a coefficient of variation of 9%.

Preparation of Photosensitive Layer Coating Liquid

To the above emulsion, $1.2 \times 10^{-4}$ mol/mol Ag of 1,3,3a,7-tetraazaindene, $1.2 \times 10^{-2}$ mol/mol Ag of hydroquinone, $3.0 \times 10^{-4}$ mol/mol Ag of citric acid, and 0.90 g/mol Ag of 2,4-dichloro-6-hydroxy-1,3,5-triazine sodium salt were added, and, furthermore, 0.85 g/mol Ag of an Epocros K-2020E (trade name, Nippon Shokubai Co., Ltd., oxazoline-functional cross-linkable polymer latex (cross-linking group: oxazoline group)) serving as a latex of water-insoluble polymer X was added. The pH was then adjusted to 5.6 using citric acid to prepare a photosensitive layer coating liquid.

Precursor-Layer-Forming Step (Corresponding to First Step)

An undercoat-layer-forming composition described below was applied to one surface of a 40 µm biaxially-oriented PET substrate so as to have a dry film thickness of 60 nm and dried at 90° C. for 1 minute to fabricate a substrate with an undercoat layer. The film thickness of the undercoat layer was measured with an electronic microfilm thickness meter available from Anritsu Corporation.

Undercoat-Layer-Forming Composition (Curable Composition)

Components below were mixed to prepare an undercoat-layer-forming composition.

| | |
|---|---|
| Acrylic polymer (AS-563A, Daicel Finechem Ltd., solid content: 27.5% by mass) | 66.4 parts by mass |
| Carbodiimide cross-linker (Carbodilite V-02-L2, Nisshinbo Inc., solid content: 10% by mass) | 16.6 parts by mass |
| Colloidal silica (Snowtex XL, Nissan Chemical Industries, Ltd., solid content: 10% by mass, water-diluted) | 4.4 parts by mass |
| Lubricant: carnauba wax (Selosol 524, Chukyo Yushi Co., Ltd., solid content: 3% by mass, water-diluted) | 27.7 parts by mass |
| Surfactant: anionic surfactant (Rapisol A-90, NOF Corporation, solid content: 1% by mass aqueous solution) | 23.3 parts by mass |
| Surfactant: nonionic surfactant (Naroacty CL95, Sanyo Chemical Industries, Ltd., solid content: 1% by mass aqueous solution) | 14.6 parts by mass |
| Distilled water | 847.0 parts by mass |

Next, to the undercoat layer of the substrate with an undercoat layer, an antihalation layer coating liquid (corresponding to a lower-coating-forming composition) described below, the photosensitive layer coating liquid (corresponding to an upper-coating-forming composition) described above, and a protective layer coating liquid (corresponding to a protective-layer-forming composition) described below, the liquids being in this order from the undercoat layer side, were simultaneously and layeredly applied in a coating liquid flow ratio (antihalation layer coating liquid/photosensitive layer coating liquid/protective layer coating liquid) of 20/25/10, thereby forming a precursor layer (silver-halide-containing photosensitive layer) on the substrate. This precursor layer is a film A.

The antihalation layer coating liquid was a composition made of a mixture of a latex of water-insoluble polymer Y and gelatin in a mass ratio (mass of water-insoluble polymer Y/mass of gelatin) of 2/1 with a dye added. The dye has an optical density of about 1.0 and will be decolorized by an alkali in a developer. The antihalation layer coating liquid contains an Epocros K-2020E (trade name, Nippon Shokubai Co., Ltd., oxazoline-functional cross-linkable polymer latex) serving as the latex of water-insoluble polymer X, and the concentration of the antihalation layer coating liquid was adjusted such that the amount of water-insoluble polymer Y and the amount of water-insoluble polymer X in a layer formed from the antihalation layer coating liquid would be 0.8 g/m² and 0.05 g/m², respectively. The layer formed from the antihalation layer coating liquid had an antihalation function due to the presence of the dye.

The latex of water-insoluble polymer Y mentioned above was a polymer latex containing a polymer (reactive group: carboxyl group) represented by (P-1) below, a dispersing agent including dialkylphenyl PEO sulfuric acid ester, and water (mass ratio of dispersing agent/polymer Y, 2.0/100=0.02; solids concentration, 22% by mass).

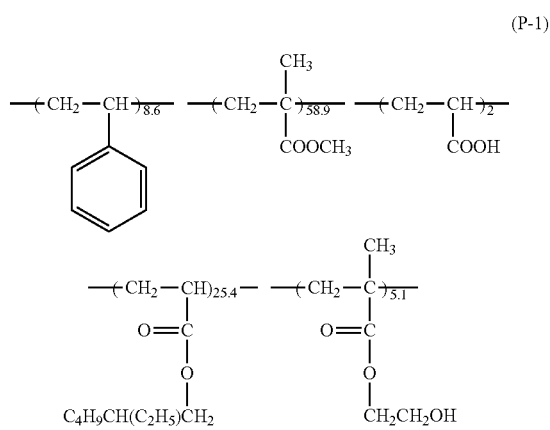

(P-1)

The protective layer coating liquid was a composition including gelatin. A VS-B (K-FJC) (trade name, Fujifilm Finechemicals Co., Ltd.) serving as a gelatin cross-linker was further added to the protective layer coating liquid. The amount of gelatin cross-linker added was adjusted such that its amount in a layer formed from the protective layer coating liquid would be 0.022 g/m². The concentration of the protective layer coating liquid was adjusted such that the gelatin content of the layer formed from the protective layer coating liquid would be 0.08 g/m².

The above gelatin cross-linker is not a polymeric water-insoluble cross-linker but a low-molecular water-soluble cross-linker having the following structure.

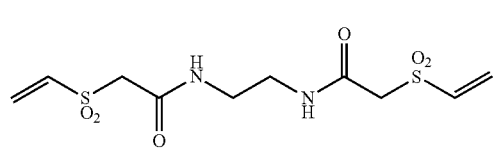 [SMILES: C=CS(=O)(=O)CC(=O)NCCNC(=O)CS(=O)(=O)C=C]

The layer (upper coating) formed from the photosensitive layer coating liquid on the substrate had a silver content of 6.2 g/m², a water-insoluble polymer X content of 0.02 g/m², and a gelatin content of 0.62 g/m².

The volume percentage of water-insoluble polymer X relative to the total volume of silver and water-insoluble polymer X in the upper coating ((volume of water-insoluble polymer X in upper coating)/(total volume of silver and water-insoluble polymer X in upper coating)) was 3% by volume.

Exposure and Development Treatment

Next, film A formed above was exposed by using an exposure machine. The exposure was performed using a high-pressure mercury lamp as a light source and a mask for forming the pattern in FIG. 3 as a photomask. Windows for light transmission of the mask used were the same as the pattern in FIG. 3. Square grid units forming a grid each have a line width of 2.5 μm, and each grid unit (opening portion) has a sidelength Pa of 300 μm.

After the exposure, the resulting film was developed with a developer described below and further subjected to a development treatment using a fixing solution (trade name: N3X-R for CN16X, Fujifilm Corporation). The resulting film was then rinsed with pure water and dried. The film obtained is a film B.

The flow of the treatment is as follows.

Treatment Flow

Developer: automatic developer (FG-710PTS) available from Fujifilm Corporation

Treatment conditions:
development at 35° C. for 30 seconds,
fixing at 34° C. for 23 seconds, and
water-washing with running water (5 L/min) for 20 seconds.

Composition of Developer

One liter (L) of a developer includes compounds below.

| | |
|---|---|
| Hydroquinone | 0.037 mol/L |
| N-Methyl aminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

Cross-Linking Reaction Treatment (Corresponding to Second Step)

Film B was heat-treated by passing it through a superheated vapor chamber at 150° C. over a 120-s period. The film that has been heat-treated is a film C.

Gelatin Decomposition Treatment (Corresponding to Third Step)

Film C was immersed in an aqueous solution of a proteolytic enzyme (Bioprase AL-15FG available from Nagase ChemteX Corporation) (proteolytic enzyme concentration, 0.5% by mass; solution temperature, 40° C.) for 120 seconds. Film C was taken out of the aqueous solution, immersed in warm water (50° C.) for 120 seconds, and washed to obtain a film D (corresponding to a conductive film) subjected to gelatin decomposition treatment.

Resistance Decreasing Treatment (Corresponding to Smoothing Step and Heating Step)

Film D was subjected to a calendering treatment at a pressure of 30 kN using a calendering apparatus including a combination of a metal roller and a resin roller, and then heat-treated by passing it through a superheated vapor chamber at 150° C. over a 120-s period. The film that has been heat-treated is a film E.

Evaluations (1) Conductive Layer Peeling Evaluation

In the gelatin decomposition treatment, the surface electrical resistance of film D subjected to the gelatin decomposition treatment was measured, and pure water at 25° C. was then sprayed thereon at a predetermined pressure for 5 seconds using a spraying device. The rate of change in electrical resistance before and after the pure water spraying was evaluated according to the following criteria. "The rate of change in electrical resistance" means (electrical resistance after pure water spraying)/(electrical resistance before pure water spraying).

AA: The rate of change in electrical resistance is 1 or less at a pressure of 1.0 MPa.

A: The rate of change in electrical resistance is 1 or less at a pressure of 0.5 MPa.

B: The rate of change in electrical resistance is more than 1 and 2 or less at a pressure of 0.5 MPa.

C: The rate of change in electrical resistance is more than 2 at a pressure of 0.5 MPa.

This evaluation is mandatory testing for resistance to peeling of silver wires. Samples evaluated as C, when subjected only to the gelatin decomposition treatment, undergo silver wire peeling or deformation that can be observed under a light microscope and are practically unacceptable. Samples evaluated as B, although not undergoing deformation when subjected only to the gelatin decomposition treatment, tend to have low resistance and may reduce production yields. Samples evaluated as A are practically acceptable. Samples evaluated as AA, by being sprayed with a treatment liquid in the gelatin decomposition treatment, can effect a gelatin decomposition reaction at a faster rate to improve productivity.

Three samples were provided in each example (corresponding to N=3), and each sample was evaluated. For example, "AA to A" in Table 1 means that there are at least one sample evaluated as "AA" and at least one sample evaluated as "A" in three samples. When the evaluation in Table 1 is "A", it means that three samples are all evaluated as "A".

(2) Haze Measurement

The haze of a square grid pattern portion of film E was measured with a haze meter (NDH7000SP available from Nippon Denshoku Industries Co., Ltd.) and evaluated according to the following criteria.

A: Haze value is 10% or less.

B: Haze value is more than 10% and 20% or less.

C: Haze value is more than 20%.

When the haze value is high, appearance defects of film E, such as foreign matter and flaws, are difficult to detect, which may cause problems in product warranty. From this viewpoint, samples evaluated as A present no problems in production. Samples evaluated as B are at acceptable levels, although it is difficult to detect their appearance defects. Samples evaluated as C are at levels that may cause problems in appearance defect detection.

(3) Conductivity Evaluation

The surface electrical resistance of a conductive layer (electrode) of film E was directly read.

A: Surface electrical resistance is 20Ω/□ or more.

B: Surface electrical resistance is 30Ω/□ or more and less than 50 Ω/□.

C: Surface electrical resistance is 50Ω/□ or more.

-: Electrical resistance is unmeasurable.

(4) Migration Evaluation

The migration evaluation was performed as follows. First, a patterned sample for migration testing was prepared using the same steps as for preparing film D, except that the photomask for forming the pattern in FIG. 3 in the exposure and development treatment step was replaced with a migration test pattern photomask in accordance with IPC-TM650 or SM840. The migration test pattern had a line width of 50 μm, a space width of 50 μm, and 17/18 lines (hereinafter referred to as an interdigitated pattern electrode).

Next, a transparent adhesive layer (trade name: 8146-2, 3M) was bonded to the interdigitated pattern portion of a sample having the interdigitated pattern electrode prepared above to prepare a sample. The sample was allowed to stand in a moist-hot atmosphere at 85° C. and 85% RH, and wires are connected to opposite ends of the interdigitated pattern. After a direct current of 5 V was continuously applied for 500 hours from one end, the sample was taken out of the atmosphere at 85° C. and 85% RH, and insulation resistance was measured with a direct current of 5 V applied using an Advantest R8340A. The evaluation was performed according to the following criteria.

A: Insulation resistance is $10^{10}\Omega$ or more.
B: Insulation resistance is reduced to less than $10^{10}\Omega$.

Examples 2 to 8 and Comparative Examples 1 to 3

Conductive films were produced by the same procedure as in Example 1 except that the amount of water-insoluble polymer X and the amount of water-insoluble polymer Y in each layer were adjusted as shown in Tables 1 and 2 below.

In Examples 1 to 7 and Comparative Examples 1 and 2 shown in Table 1, an "Epocros K-2020E (trade name, Nippon Shokubai Co., Ltd., oxazoline-functional cross-linkable polymer latex)" was used as polymer X, and the "polymer represented by (P-1)" as polymer Y.

In Table 2, the "polymer type" column shows the type of polymer X and polymer Y used in Example and Comparative Example. More specifically, in Example 8, "*1: polymer represented by (P-1) (reactive group: carboxyl group)" was used as polymer Y, and "*2: Carbodilite E03A, Nisshinbo Inc. (emulsion) (cross-linking group: carbodiimide group)" as polymer X (water-insoluble polymer X).

In Comparative Example 3, a water-soluble cross-linker was used as polymer Y. More specifically, "*1: polymer represented by (P-1) (reactive group: carboxyl group)" was used as polymer Y, and "*3: Carbodilite V-02-L2 (water-soluble cross-linker)" as polymer X.

Method of Calculating Average Area Fraction

The conductive layers of the conductive films (films E) obtained in Examples and Comparative Examples were each cut by the method described above using a microtome. The cut section was observed using a model S-5500 scanning electron microscope available from Hitachi High-Technologies Corporation (acceleration voltage, 2 kV; magnification, 30,000×; reflected electronic image), and a sectional SEM (scanning electron microscope) image was taken. In the vertical section image of the conductive layer, when a contour along a profile of a surface X of the conductive layer is moved from the surface X being a surface on a side opposite to the support side toward the support side, a position where the contour reaches the metal component included in the conductive layer is an upper end position.

When the contour is then moved from the upper end position toward the substrate side, a position where the metal component ceases to exist in the conductive layer is a lower end position. The area fraction (%) of the metal component ({(area of metal component)/(area of metal-containing region)}×100)) in a region (metal-containing region) extending from a middle position between the upper end position and the lower end position toward the support side by 50 nm and toward the surface X side by 50 nm was determined. This measurement was performed at randomly selected 10 points, and the arithmetic average of the measured values was calculated to determine the average area fraction.

In calculating the area fraction, image processing software ImageJ was used. Specifically, the sectional SEM micrograph was binarized into white segments (metal component, gray value=255) and black segments (binder portion, gray value=0), and the mean gray value of the metal-containing region was measured. A value obtained by dividing the measured value by 255 and multiplying the quotient by 100 was employed as an area fraction (%).

In Tables 1 and 2, "unevaluable" in the "average area fraction in metal-containing region (%)" column indicates that a metal thin wire was lost due to film peeling so that the measurement could not be performed.

All the polymers X and the polymers Y used in Examples (Examples 1 to 8) in Tables 1 and 2 correspond to the water-insoluble polymer described above.

The polymer X used in Comparative Example 3 does not correspond to the water-insoluble polymer described above.

TABLE 1

| | Photosensitive layer (corresponding to upper coating) | | Antihalation layer (corresponding to lower coating) | | | Average area fraction in metal-containing region (%) | Evaluation | | | |
|---|---|---|---|---|---|---|---|---|---|---|
| | Polymer Y (g/m$^2$) | Polymer X (g/m$^2$) | Polymer Y (g/m$^2$) | Polymer X (g/m$^2$) | Presence of polymer W | | Conductive layer peeling | Haze | Electrical resistance | Migration |
| Example 1 | 0 | 0.02 | 0.8 | 0.05 | yes | 91 | AA to A | A | A | A |
| Example 2 | 0.02 | 0 | 0.8 | 0.05 | yes | 91 | A | A | A | A |
| Example 3 | 0.01 | 0.01 | 0.8 | 0.05 | yes | 91 | AA | A | A | A |
| Comparative Example 1 | 0.02 | 0 | 0.85 | 0 | no | unevaluable | C | — | — | — |
| Example 4 | 0 | 0.02 | 0.85 | 0 | yes | 91 | B | A | A | A |
| Example 5 | 0.01 | 0.01 | 0.85 | 0 | yes | 91 | A | A | A | A |
| Comparative Example 2 | 0 | 0.02 | 0 | 0.85 | no | unevaluable | B to C | — | — | — |
| Example 6 | 0.02 | 0 | 0 | 0.85 | yes | 91 | A to B | B | A | A |
| Example 7 | 0.01 | 0.01 | 0 | 0.85 | yes | 91 | A | B | A | A |

TABLE 2

| | Polymer type | | Photosensitive layer (corresponding to upper coating) | | Antihalation layer (corresponding to lower coating) | | Presence of polymer W | Average area fraction in metal-containing region (%) | Evaluation | | | |
|---|---|---|---|---|---|---|---|---|---|---|---|---|
| | Polymer Y | Polymer X | Polymer Y (g/m²) | Polymer X (g/m²) | Polymer Y (g/m²) | Polymer X (g/m²) | | | Conductive layer peeling | Haze | Electrical resistance | Migration |
| Example 8 | *1 | *2 | 0.01 | 0.01 | 0.85 | 0 | yes | 91 | A to B | A | A | A |
| Comparative Example 3 | *1 | *3 | 0.01 | 0.01 | 0.85 | 0 | yes | 80 | B | A | B | B |

As shown in Table 1, conductive films obtained by the method for producing a conductive film according to the present invention were determined to produce the desired effects.

In particular, comparisons between Examples 1 and 4 and between Examples 2 and 6 show that to better produce the effects of the invention, an embodiment in which one of the lower-coating-forming composition and the upper-coating-forming composition includes both polymer X and polymer Y and the other one of the lower-coating-forming composition and the upper-coating-forming composition includes at least one of polymer X or polymer Y is preferred (in particular, an embodiment in which the lower-coating-forming composition includes both polymer X and polymer Y and the upper-coating-forming composition includes at least one of polymer X or polymer Y is more preferred).

A comparison among Examples 3, 5, and 7 shows that to best produce the effects of the invention, an embodiment in which both the lower-coating-forming composition and the upper-coating-forming composition include polymer X and polymer Y is most preferred.

A comparison between Example 5 and Example 8 shows that when one of the cross-linking group and the reactive group is an oxazoline group, conductive layer peeling is less likely to occur.

By contrast, in Comparative Example 1 in which polymer X was not used and Comparative Example 2 in which polymer Y was not used, conductive layer peeling occurred.

In Comparative Example 3 in which a water-soluble cross-linker was used as polymer X, conductive properties were inferior to those in Examples, and the occurrence of migration was also observed.

Also when "Carbodilite V-02-L2" used in Comparative Example 3 was replaced with "EPOXY RESIN DY 022 (trade name, Nagase ChemteX Corporation)", the results were substantially the same as in Comparative Example 3, and the desired effects were not produced.

REFERENCE SIGNS LIST 10 conductive film
12 substrate
14A conductive layer
14B conductive thin wire
16 polymer W
18 metal component
20 metal-containing region
26 opening portion
114A surface
UP upper end position
LP lower end position
MP middle position
P1, P2 position
Pa sidelength of opening portion

What is claimed is:

1. A method for producing a conductive film having a substrate and a conductive layer disposed on the substrate, the method comprising:
    a first step of forming a precursor layer on the substrate, the precursor layer including a metal component or its precursor, a water-insoluble polymer X having a cross-linking group, a water-insoluble polymer Y having a reactive group that reacts with the cross-linking group, and a water-soluble polymer Z different from the water-insoluble polymer X and the water-insoluble polymer Y;
    a second step of reacting the cross-linking group in the water-insoluble polymer X with the reactive group in the water-insoluble polymer Y; and
    a third step of forming the conductive layer by removing the water-soluble polymer Z.

2. The method for producing a conductive film according to claim 1, wherein the first step has forming the precursor layer by applying to the substrate a lower-coating-forming composition including at least one of the water-insoluble polymer X or the water-insoluble polymer Y and an upper-coating-forming composition at least including the other one of the water-insoluble polymer X or the water-insoluble polymer Y, the water-soluble polymer Z, and the metal component or its precursor.

3. The method for producing a conductive film according to claim 2, wherein one of the cross-linking group and the reactive group is an oxazoline group.

4. The method for producing a conductive film according to claim 1, wherein one of the cross-linking group and the reactive group is an oxazoline group.

5. The method for producing a conductive film according to claim 1, wherein the water-soluble polymer Z includes gelatin.

6. The method for producing a conductive film according to claim 1, wherein the metal component or its precursor is a silver halide,
    the method further comprising, before the third step, subjecting the silver halide to an exposure treatment and then performing a development treatment to form metal silver.

7. The method for producing a conductive film according to claim 1, the method further comprising, after the third step, performing a heat treatment on the conductive layer.

8. A conductive film comprising a substrate and a conductive layer that is disposed on the substrate and includes a metal component,
    wherein the conductive layer includes a polymer W formed as a result of a reaction between a water-insoluble polymer X having a cross-linking group and a water-insoluble polymer Y having a reactive group that reacts with the cross-linking group, in the conductive layer, an average area fraction of the metal component is 85% or more in a metal-containing region, and in a vertical section of the conductive layer, the metal-containing region is a region extending from a middle position between an upper end position and a lower end position toward the substrate side by 50 nm and toward a surface X side by 50 nm; when a contour along a profile of the surface X of the conductive layer is moved from the surface X being a surface on a side opposite to the substrate side toward the substrate side, a position where the contour reaches the metal component included in the conductive layer is the upper end position; and when the contour is moved from the upper end position toward the substrate side, a position where the metal component ceases to exist in the conductive layer is the lower end position.

9. The conductive film according to claim 8, wherein one of the cross-linking group and the reactive group is an oxazoline group.

10. A touch panel comprising the conductive film according to claim 8.

* * * * *